United States Patent [19]
Hirota et al.

[11] Patent Number: 5,995,262
[45] Date of Patent: Nov. 30, 1999

[54] SIGNAL TRANSMISSION BUS AND SIGNAL PROCESSING APPARATUS

[75] Inventors: Masaki Hirota, Ebina; Kenji Kawano; Masahiro Taguchi, both of Nakai-machi; Junji Okada, Ebina; Masao Funada; Takashi Ozawa, both of Nakai-machi, all of Japan

[73] Assignee: Fuji Xerox Co., Ltd., Tokyo, Japan

[21] Appl. No.: 08/759,754

[22] Filed: Dec. 3, 1996

[30] Foreign Application Priority Data

Apr. 1, 1996 [JP] Japan .................................. 8-078822

[51] Int. Cl.$^6$ .............................. H04B 10/12; G02B 6/22
[52] U.S. Cl. .......................... 359/163; 359/173; 385/131
[58] Field of Search .................................. 359/163, 173, 359/109; 385/14, 33, 35, 49, 89, 101, 129, 40, 131, 132, 106; 361/761; 257/59, 82, 432

[56] References Cited

U.S. PATENT DOCUMENTS

| | | | |
|---|---|---|---|
| 4,499,608 | 2/1985 | Broockman et al. | 359/163 |
| 4,758,063 | 7/1988 | Konechny | 350/96.2 |
| 4,863,232 | 9/1989 | Kwa | 350/96.2 |
| 5,093,890 | 3/1992 | Bergman et al. | 385/146 |
| 5,202,940 | 4/1993 | Betts | 385/24 |
| 5,268,973 | 12/1993 | Jenevein | 385/74 |
| 5,416,872 | 5/1995 | Sizer, II et al. | 385/92 |
| 5,432,630 | 7/1995 | Lebby et al. | 359/152 |
| 5,535,034 | 7/1996 | Taniguchi | 359/152 |
| 5,535,036 | 7/1996 | Grant | 359/163 |
| 5,561,727 | 10/1996 | Akita et al. | 385/88 |
| 5,659,648 | 8/1997 | Knapp et al. | 385/129 |

FOREIGN PATENT DOCUMENTS

| | | |
|---|---|---|
| 61-196210 | 8/1986 | Japan . |
| 2-41042 | 2/1990 | Japan . |

OTHER PUBLICATIONS

Institute of Research & Development, Tokai University, 15C01, Lecture Meeting on Circuit Implementation, Sadaji Uchida, pp. 201–202. IEEE Tokyo Section, Denshi Tokyo, No. 33, 1994, "Packaging Technology for Optical Interconnects", H. Tomimuro et al., pp. 81–86.

Artech House, Inc., 1994, "Optical Interconnection Foundations and Applications", Christopher Tocci et al., pp. 228–237. Optronics, No. 6, 1992, "Two–dimensional optical buses using planar optics", S. Kawai, pp. 100–106.

*Primary Examiner*—Leslie Pascal
*Attorney, Agent, or Firm*—Oliff & Berridge, PLC

[57] ABSTRACT

A signal transmission bus comprising a plurality of optical transmission layers and optical isolation layers stacked alternately. Each of the optical transmission layers has signal light input thereinto and propagating the input signal light diffusedly. Each of the optical isolation layers prevents the mixing of the signal light between any two adjacent optical transmission layers. At least one of the optical isolation layers comprises electrical wiring for transmitting electrical signals.

8 Claims, 3 Drawing Sheets

SIGNAL TRANSMISSION BUS AND SIGNAL PROCESSING APPARATUS

BACKGROUND OF THE INVENTION

1. Field of the Invention

The present invention relates to a signal transmission bus for transmitting signals between a plurality of circuit boards and a signal processing apparatus utilizing that signal transmission bus.

2. Description of the Related Art

New developments in the art of very-large-scale integration (VLSI) have significantly enhanced the functions of daughter boards used by data processing systems. The growing capabilities of circuits requires connecting an increasing number of signals to each of configured circuit boards. The trend has entailed the adoption of a parallel architecture wherein the data bus board (i.e., mother board) for interconnecting circuit boards through a parallel bus structure comprises a large number of connectors and connecting lines. The operating speed of the parallel bus structure is boosted conventionally by installing connecting lines in a plurality of layers and by miniaturizing the wiring layer setup. In such an architecture, the line capacity of connection wiring and wiring resistance produce signal delays that determine the operating speed of the parallel bus structure. In turn, the operating speed of the parallel bus structure may constrain the processing speed of the system. Another major constraint on the efforts to increase the processing speed of the system is the problem of electromagnetic interference (EMI) stemming from the large-scale integration of the parallel bus connection wiring.

In an attempt to solve the above problems and to enhance the operating speed of the parallel bus structure, researchers have examined the use of an intra-system optical connection technique called the optical interconnection. Various applications of the optical interconnection technique varying with the system configuration have been disclosed. Some of these application are discussed illustratively by Sadaji Uchida in the paper presented to the Lecture Meeting on Circuit Implementation, 15C01, pp. 201–202, and by H. Tomimuro et al., in "Packaging Technology for Optical Interconnects," IEEE Tokyo Section, Denshi Tokyo No. 33, pp. 81–86, 1994.

One of the simplest applications is depicted illustratively by Christopher et al., in "Optical Interconnection Foundations and Applications," Artech House Inc., Boston, London, 1994. Chapter 6 of this publication describes a typical setup wherein circuit boards are interconnected by a single optical fiber cable and the interface between the boards is composed of light-emitting and light-receiving elements as well as parallel-serial conversion circuits. In this setup, the electronic circuits on the circuit boards are connected by a 32-bit parallel electrical bus structure. With the clock time assumed to be about 50 MHz, the parallel-serial conversion circuits between the parallel electric bus and the serial optical bus are required to operate approximately at 2.7 GHz.

Where parallel electrical signals are converted to serial optical signals in order to interconnect the circuit boards by the optical fiber cable, as in the above example, the data transmission rate of the bus is determined by the operating speed of the parallel-serial conversion circuits. If the bit count of the electronic circuitry is increased to 64 or to 128, it is difficult to enhance the data transmission rate correspondingly. To improve the operating speed of the parallel-serial conversion circuits for higher data transmission rates requires installing expensive electronic circuits. Furthermore, boosting the operating speed requires the parallel-serial conversion circuits to consume drastically large amounts of power.

Japanese Unexamined Patent Application No. Hei 2-41042 discloses an example in which an optical transmission system using high-speed, high-sensitivity light-emitting/receiving devices is applied to the data bus. The proposed application involves a parallel optical data bus structure for loop transmission between contiguous circuit boards incorporated in a system frame, each circuit board carrying light-emitting and light-receiving devices on both sides, the devices being optically connected across the space.

In the system cited above, signal light sent from one circuit board is converted by the adjacent circuit board first from optical to electrical format and then from electrical to optical format before the signal light is forwarded to the next adjacent circuit board. That is, the optical-to-electrical and electrical-to-optical conversions are repeated by each of the circuit boards included in the system frame, until the signal is transmitted through all the circuit boards configured. This means that the signal transmission speed depends on and is restricted by the optical-to-electrical and electrical-to-optical conversion speeds of the light-receiving and light-transmitting devices mounted on all circuit boards. Because data is transmitted from one circuit board to another via optical connections across the free space between the light-receiving and light-emitting devices, it is required that the light-receiving and light-emitting devices mounted on both sides of each of the contiguous circuit boards be optically aligned and that all circuit boards be optically connected.

Because the circuit boards are optically connected across the free space, faulty transmission of data therebetween may result from cross talk between contiguous optical data transmission routes. Defective data transmission may also occur when the signal light is diffused by ambient factors such as dust inside the system frame. Furthermore, since the circuit boards are serially connected, dismounting any one of the boards disrupts the integral flow of data; an extra circuit board must fill the vacated board position. In other words, the number of the circuit boards configured is fixed, and none of the boards can be freely detached.

Another application of the optical interconnection is disclosed in Japanese Unexamined Patent Application No. Sho 61-196210 regarding techniques for optical data transmission between circuit boards across the free space. What is disclosed is a system of optically connecting circuit boards via optical transmission routes across the free space, the system involving plates each having two parallel surfaces and located opposite to a light source, the plate surfaces bearing diffraction grating and reflector elements. With this system, a light beam generated from a single point is transmitted to another point that is fixed. This system is incapable of interconnecting all circuit boards in the same manner as the electrical bus structure. The use of the free space necessitates complicated optics with its optical elements difficult to align. Misalignment of optical elements can produce cross talk between contiguous optical data transmission routes, resulting in faulty data transmission. The information about the connection between the circuit boards is determined by the diffraction grating and reflector elements mounted on the plate surfaces. This makes it impossible to detach or attach circuit boards as needed, which reduces the degree of flexibility where the system configuration is desired to be altered.

SUMMARY OF THE INVENTION

It is therefore an object of the present invention to provide a signal transmission bus and a signal processing apparatus using that bus which is highly resistant to cross talk and electromagnetic interference, is easy to align, and allows circuit boards to be mounted and dismounted as desired.

In carrying out the invention and according to one aspect thereof, there is provided a signal transmission bus comprising a plurality of optical transmission layers and optical isolation layers stacked alternately, each of the optical transmission layers having signal light input thereinto and propagating the input signal light diffusedly, each of the optical isolation layers preventing the mixing of the signal light between any two adjacent optical transmission layers, wherein at least one of the optical isolation layers comprises electrical wiring for transmitting electrical signals.

According to another aspect of the invention, there is provided a signal processing apparatus comprising: a base; a signal transmission bus comprising a plurality of optical transmission layers and optical isolation layers stacked alternately, each of the optical transmission layers having signal light input thereinto and propagating the input signal light diffusedly, each of the optical isolation layers preventing the mixing of the signal light between any two adjacent optical transmission layers, wherein at least one of the optical isolation layers comprises electrical wiring for transmitting electrical signals; a plurality of circuit boards each including signal light transmitting terminals for exchanging the signal light with any one of the optical transmission layers, and electrical signal transmitting terminals for exchanging the electrical signals with the electrical wiring formed in at least one of the optical isolation layers; and a board fixture for fastening each of the circuit boards in such a way that the signal light transmitting terminals mounted on any circuit board are optically connected to the optical transmission layers in the signal transmission bus and that the electrical signal transmitting terminals furnished on any circuit board are electrically connected to the electrical wiring in the signal transmission bus.

According to a further aspect of the invention, there is provided a circuit board comprising: a plurality of signal light transmitting terminals for exchanging signal light with external optical connectors; a plurality of electrical signal transmitting terminals for exchanging electrical signals with external electrical connectors; a circuit operating in response to the signals input via the signal light transmitting terminals and the electrical signal transmitting terminals; and a board having the circuit, the signal light transmitting terminals and the electrical signal transmitting terminals integrally mounted thereon, the signal light transmitting terminals and the electrical signal transmitting terminals being connected to the external optical connectors and the external electrical connectors simultaneously when the circuit board is installed for connection with the connectors.

These and other objects, features and advantages of the invention will become more apparent upon a reading of the following description and appended drawings.

DESCRIPTION OF THE PREFERRED EMBODIMENTS

Preferred embodiments of the invention will now be described with reference to the accompanying drawings.

Figure 1:
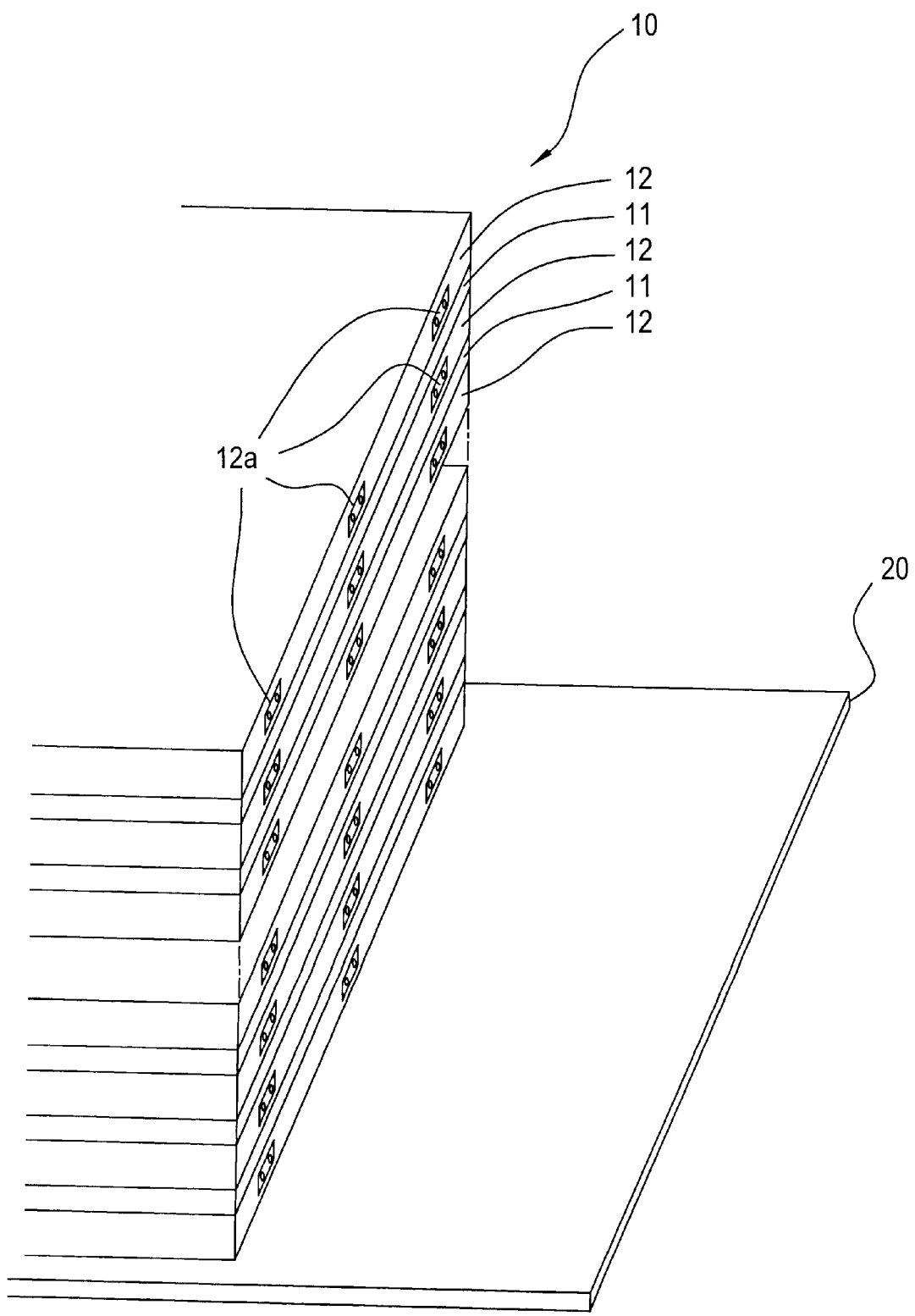
FIG. 1 is a schematic view of a signal transmission bus embodying the invention.

FIG. 1 schematically depicts a signal transmission bus embodying the invention. As shown in FIG. 1, a signal transmission bus 10 has a plurality of sheet-like optical transmission layers 11 and optical isolation layers stacked alternately and mounted on a base 20.

Each of the optical transmission layers 11 has signal light input thereinto and propagates the input signal light diffusedly. Each optical isolation layer 12 is a layer that prevents the mixing of the signal light between adjacent optical transmission layers 11.

The optical transmission layer 11 is formed by polymethyl methacrylate (PMMA) known for its high transmittance, and the optical isolation layer 12 is composed of a material with a refractive index lower than that of the optical transmission layer 11. Where the optical transmission layer 11 is formed by polymethyl methacrylate, the optical isolation layer 12 is generally constituted by fluorine polymer.

The optical transmission layer 11 keeps its diffusive property by having polystyrene (PS) dispersed throughout its polymethyl methacrylate content, the two ingredients differing in refractive index. Alternatively, the optical transmission layer 11 may be equipped with an optical diffusion member instead of the optical diffuser being dispersed within its content. For example, an optically diffusive lens may be attached to the layer portion through which signal light is input. Another example may involve positioning an optical diffusion plate in the path of an input laser beam propagating linearly inside the optical transmission layer, the plate reflecting the light diffusedly. The problems of light intensity attenuation and delays in light propagation are optimally alleviated by use of the optical diffusion member for optical diffusion purposes.

Inside each optical isolation layer 12 in the signal transmission bus 10 is electrical wiring, not shown, for transmitting power and electrical signals. The electrical wiring inside the optical isolation layer 12 is composed of metal such as copper appropriate for electrical signal transmission. An edge of the optical isolation layer 12 having the electrical wiring formed therein carries electrical connection terminals 12a for connecting the metal wiring to the outside.

How the signal transmission bus 10 is illustratively manufactured will now be described. What needs to be prepared are single-layer sheets of polymethyl methacrylate 0.5 mm thick each for making up optical transmission layers, and single-sheet fluorine polymer 3.0 mm thick each for constituting optical isolation layers. As many single-layer sheets as the number of the layers involved need to be provided. The two kinds of single-layer sheets are stacked alternately and pressed together. This produces the signal transmission bus 10 of a stacked layer structure as shown in FIG. 1.

What follows is a description of a signal processing apparatus employing the signal transmission bus 10 thus manufactured. The signal transmission bus 10 is first fastened onto a base 20. A plurality of circuit boards are attached fixedly to the signal transmission bus 10. In this setup, the optical transmission layers in the signal transmission bus 10 are optically connected to the signal light transmitting terminals of the multiple circuit boards configured. The metal wiring contained in the optical isolation layers 12 in the bus 10 are electrically connected to the electrical signal transmitting terminals furnished on the circuit boards. The above setup thus constitutes a signal processing apparatus.

Figure 2:
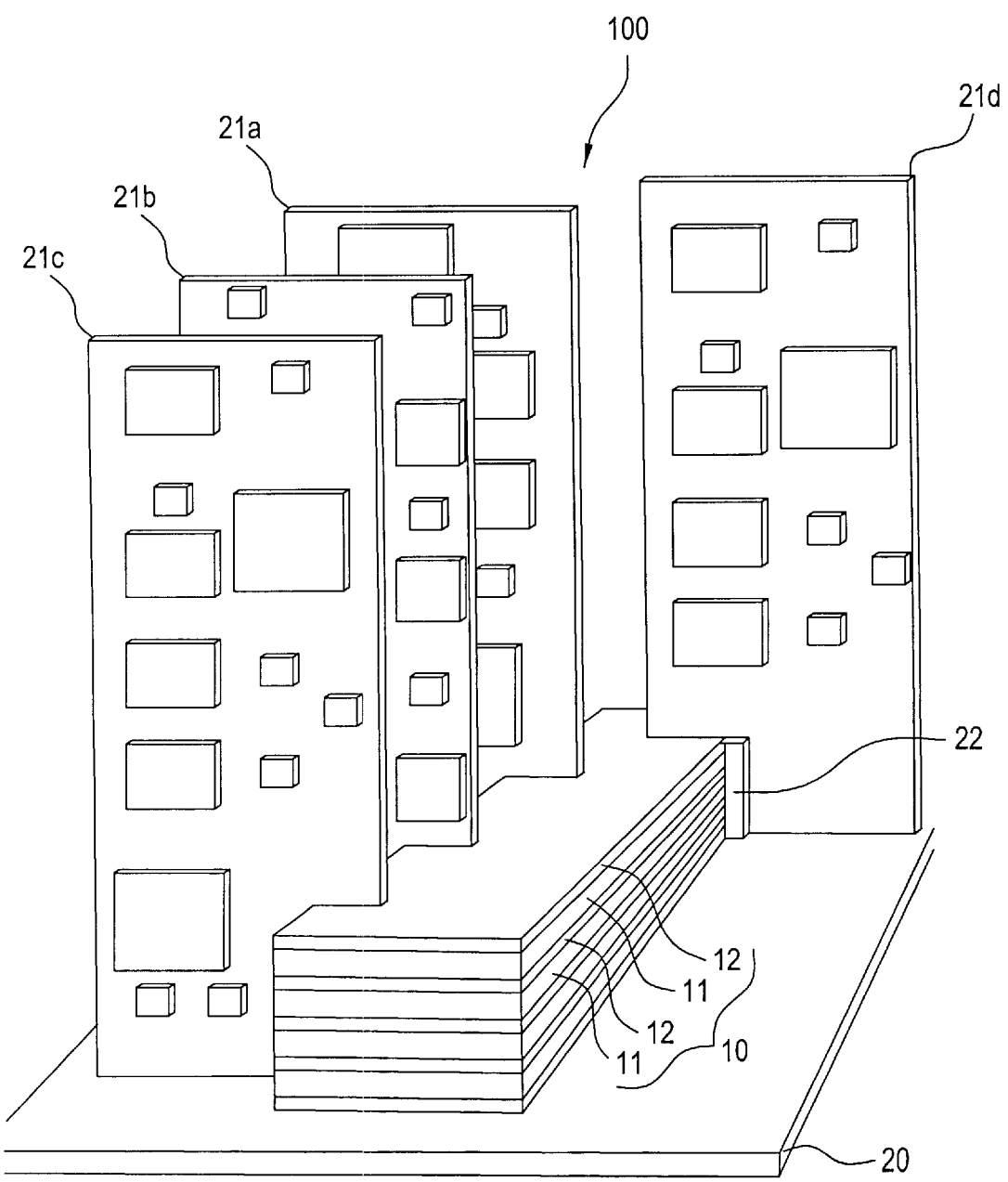
FIG. 2 is a schematic view of a signal processing apparatus also embodying the invention.

FIG. 2 schematically illustrates such a signal processing apparatus also embodying the invention. As shown in FIG. 2, the signal processing apparatus 10 comprises a base 20, a signal transmission bus 10 fastened onto the base 20, and a plurality of circuit boards 21a, 21b, 21c., etc. The signal transmission bus 10 is manufactured as described, with the optical transmission layers 11 and optical isolation layers 12 stacked alternately (FIG. 1).

The circuit boards 21a, 21b, 21c, etc., each incorporate optical signal processing circuits and/or electrical signal processing circuits formed by chips such as VLSI's. An edge of each of the circuit boards is furnished with a board fixture 22 for fastening the board to the signal transmission bus 10.

Figure 3:
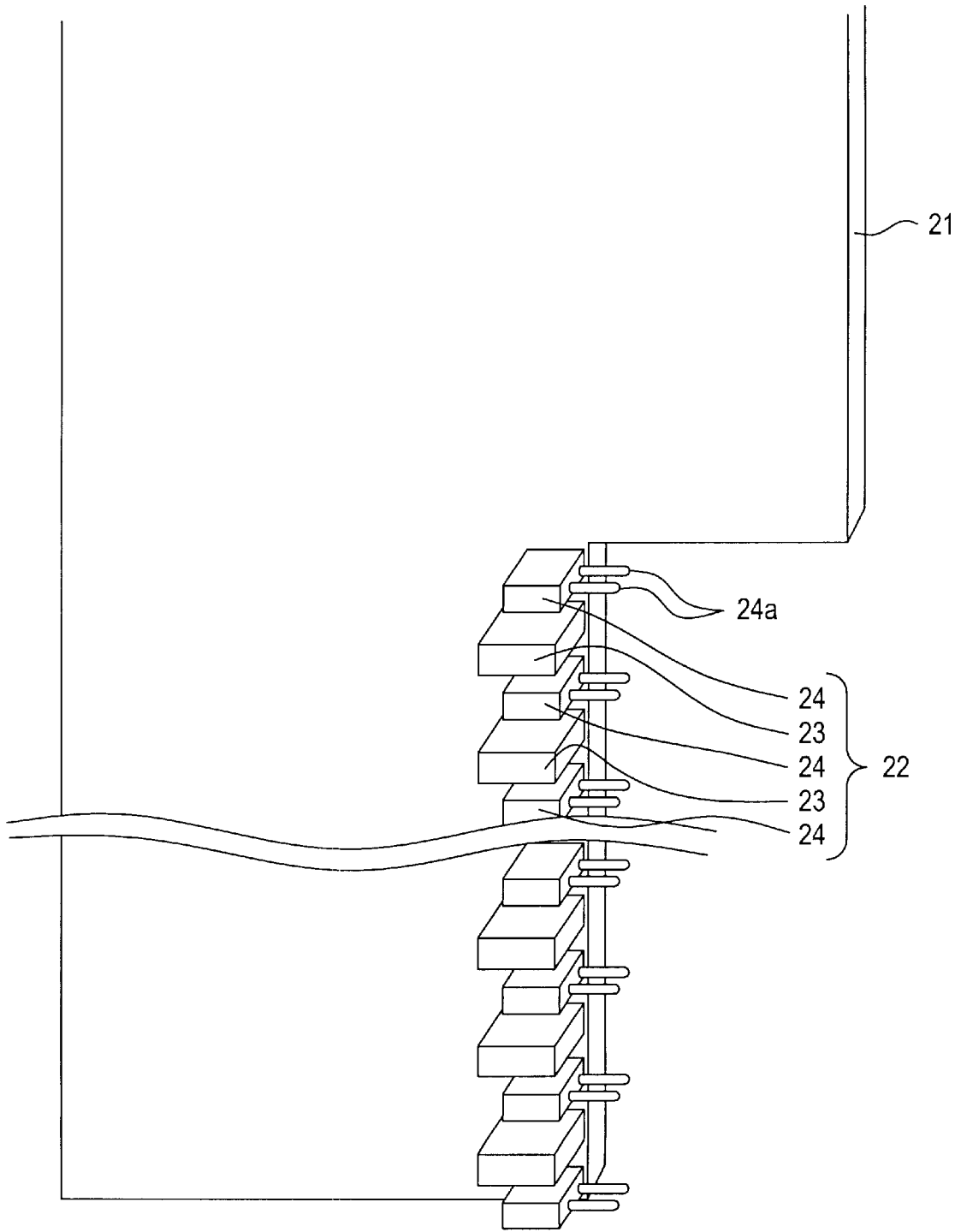
FIG. 3 is a schematic view of a board fixture furnished to each of the circuit boards constituting the signal processing apparatus of FIG. 2.

FIG. 3 schematically shows the board fixture furnished to each of the circuit boards constituting the signal processing apparatus of FIG. 2. As illustrated in FIG. 3, the board fixture 22 on the edge of each circuit board 21 has a plurality of light-receiving/emitting devices 23 and electrical connection terminals 24 arranged alternately. The light-receiving/emitting devices 23 exchange signal light with the optical transmission layers 11 in the signal transmission bus 10 of FIG. 1. The electrical connection terminals 24 exchange electrical signals with the optical isolation layers 12 in the same bus 10.

To combine the circuit boards 21a, 21b, 21c, etc., with the signal transmission bus 10 in FIG. 1 requires that the light-receiving/emitting devices 23 on the circuit board side be optically connected to the optical transmission layers 11 on the signal transmission bus side, and that the electrical connection terminals 24 on the board side be electrically connected to their counterparts 12a on the bus side.

As described, the signal transmission bus embodying the invention (FIG. 1) has the optical transmission layers 11 and optical isolation layers 12 stacked alternately. The circuit boards to be combined with the signal transmission bus have the light-receiving/emitting devices 23 and electrical connection terminals 24 furnished at a pitch corresponding with that of the optical transmission layers 11 and optical isolation layers 12. The signal pins 24a projecting from the electrical connection terminals 24 (see FIG. 3) on the board fixture 22 at the board edge are inserted into the electrical connection terminals 12a (see FIG. 1) at an edge of the optical isolation layers 12 of the signal transmission bus 10 to thereby fasten the circuit board 21 to the signal transmission bus 10 and automatically establish optical alignment between the board and the bus. Combining the necessary circuit boards with the signal transmission bus in the above manner completes the signal processing apparatus 100.

In the embodiment above, the optical transmission layers of the signal transmission bus are formed by polymethyl methacrylate. Alternatively, the optical transmission layers may be composed of any other plastic material having similar optical characteristics such as polystyrene (PS) and polycarbonate (PC). Where polystyrene or polycarbonate is used to fabricate the optical transmission layers in the signal transmission bus, the optical isolation layers thereof may still be constituted by fluorine polymer.

In the above embodiment, the single-layer sheet for forming each optical transmission layer in the signal transmission bus is set to be 0.5 mm thick and the single-layer sheet for constituting each optical isolation layer in the same bus is supposed to be 3.0 mm in thickness. However, these settings are not limitative of the invention. Thicker or thinner sheets than the prescribed sheets may be used as long as the optical characteristics of the optical transmission and isolation layers fabricated thereby remain intact.

In the above embodiment, plastic materials are used to form the optical transmission and isolation layers. Alternatively, the layers may be formed by crystal glass materials replacing the plastic materials. If crystal glass materials are adopted in fabricating the optical transmission and isolation layers, refractive index adjusting agents such as $P_2O_5$, $Al_2O_3$ and $B_2O_3$ should be added to the base material so as to control the refractive index of the resulting sheets. The sheets for constituting the optical transmission and isolation layers are then combined selectively in such a way that the two kinds of layers differ significantly in refractive index.

In the above embodiment, the board fixture 22 is furnished on each of the circuit boards 21. Alternatively, the board fixture may be provided on the base. Although the embodiment above has been shown using the light-receiving/emitting devices 23 as signal light transmitting terminals, this is not limitative of the invention; any other appropriate optical transmitters may be used in their place. Whereas the embodiment adopts the electrical connection terminals 24 in the form of pin-type male-female connectors, any other appropriate electrical transmitting devices may replace the terminals 24.

In the above-described embodiment, all optical isolation layers 12 have been shown containing the electrical wiring (FIG. 1). However, that arrangement is not mandatory and is not limitative of the invention; at least one of a plurality of optical isolation layers 12 need only comprise electrical wiring.

As described, the signal transmission bus and signal processing apparatus according to the invention are characterized by the presence in their constitution of an optical isolation layer between any two adjacent optical transmission layers. This setup eliminates cross talk between the optical signals propagated through the optical transmission layers in the bus. Since the main high-speed signal is optically transmitted, there is no possibility of electromagnetic interference occurring as in the case of the electrical transmission bus.

Because the signal light of the circuit boards is directly transmitted via their board fixtures to the optical transmission layers of the bus, the signal transmission is not affected by ambient conditions such as temperature and dust. Simply plugging the electrical signal transmitting terminals on the circuit board side into their counterparts on the signal transmission bus automatically completes precise optical connection between the board and the bus. This feature provides for easy optical alignment.

Furthermore, removing or reinstalling any circuit board does not affect the other circuit boards in their connection. This makes it possible to mount or dismount the circuit boards freely depending on the desired change in the system configuration.

As many apparently different embodiments of this invention may be made without departing from the spirit and scope thereof, it is to be understood that the invention is not limited to the specific embodiments thereof except as defined in the appended claims.

What is claimed is:

1. A signal processing apparatus comprising:

a base;

a signal transmission bus comprising a plurality of optical transmission layers and optical isolation layers stacked alternately, each of said optical transmission layers having signal light input thereinto and propagating the input signal light diffusedly, each of said optical isolation layers preventing the mixing of the signal light between any two adjacent optical transmission layers, wherein at least one of said optical isolation layers comprises electrical wiring for transmitting electrical signals;

a plurality of circuit boards each including signal light transmitting terminals for exchanging said signal light with any one of said optical transmission layers, and electrical signal transmitting terminals for exchanging said electrical signals with said electrical wiring formed in at least one of said optical isolation layers; and a board fixture for fastening each of said circuit boards in such a way that said signal light transmitting terminals mounted on any circuit board are optically connected to said optical transmission layers in said signal transmission bus and that said electrical signal transmitting terminals furnished on any circuit board are electrically connected to said electrical wiring in said signal transmission bus.

2. A signal processing apparatus according to claim 1, wherein more than one of said optical isolation layers comprise electrical wiring for transmitting the electrical signals.

3. A signal processing apparatus according to claim 1, wherein said electrical wiring is located inside said isolation layers.

4. A signal processing apparatus according to claim 1, wherein said signal light transmitting terminals and said electrical signal transmitting terminals are furnished at a pitch corresponding with a pitch of said optical transmission layers and said electrical signal transmitting layers.

5. A signal processing apparatus according to claim 1, wherein each of said circuit boards may be freely removed or reinstalled.

6. A circuit board comprising:

a plurality of signal light transmitting terminals for exchanging signal light with external optical connectors;

a plurality of electrical signal transmitting terminals for exchanging electrical signals with external electrical connectors;

a circuit operating in response to the signals input via said signal light transmitting terminals and said electrical signal transmitting terminals; and a board having said circuit, said signal light transmitting terminals and said electrical signal transmitting terminals integrally mounted thereon, said signal light transmitting terminals and said electrical signal transmitting terminals being connected to said external optical connectors and said external electrical connectors simultaneously when said circuit board is installed for connection with the connectors, wherein said signal light transmitting terminals and said electrical signal transmitting terminals are arranged alternately.

7. A circuit board according to claim 6, wherein said signal light transmitting terminals and said electrical signal transmitting terminals are furnished at a pitch corresponding with a pitch of said external optical connectors and said external electrical connectors.

8. A circuit board according to claim 6, wherein said circuit board may be freely removed or reinstalled.

\* \* \* \* \*